US008558826B2

(12) United States Patent

Ito et al.

(10) Patent No.: US 8,558,826 B2

(45) Date of Patent: Oct. 15, 2013

(54) DISPLAY DEVICE AND DRIVING CIRCUIT FOR DISPLAY DEVICE

(75) Inventors: Kazuhito Ito, Osaka (JP); Junji Takiguchi, Osaka (JP); Tooru Suyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 855 days.

(21) Appl. No.: 12/134,597

(22) Filed: Jun. 6, 2008

(65) Prior Publication Data

US 2008/0316196 A1 Dec. 25, 2008

(30) Foreign Application Priority Data

Jun. 22, 2007 (JP) ................................ 2007-165221

(51) Int. Cl.

*G06F 3/038* (2013.01)
*G09G 5/00* (2006.01)
*G09G 3/36* (2006.01)
*G11C 19/00* (2006.01)

(52) U.S. Cl.

USPC ............... 345/212; 345/98; 345/99; 345/100; 377/64

(58) Field of Classification Search

USPC ........................................................ 345/212

See application file for complete search history.

(56) References Cited

U.S. PATENT DOCUMENTS

| | | | | |
|---|---|---|---|---|
| 6,331,846 | B1 | 12/2001 | Nakao | |
| 6,424,219 | B1 * | 7/2002 | Kato | 330/255 |
| 6,667,732 | B1 | 12/2003 | Katase | |
| 6,738,037 | B1 | 5/2004 | Akimoto | |
| 7,292,217 | B2 | 11/2007 | Tseng et al. | |
| 7,652,538 | B2 * | 1/2010 | Choi | 330/292 |
| 7,663,619 | B2 * | 2/2010 | Morita | 345/212 |
| 2004/0000949 | A1 | 1/2004 | Tsuchi | |
| 2005/0206629 | A1 | 9/2005 | Tseng et al. | |
| 2005/0285837 | A1 | 12/2005 | Akimoto | |
| 2007/0159248 | A1 * | 7/2007 | Tsuchi | 330/253 |

FOREIGN PATENT DOCUMENTS

| | | |
|---|---|---|
| JP | 09-219636 | 8/1997 |
| JP | 11-041086 | 2/1999 |
| JP | 11-161237 | 6/1999 |
| JP | 11-305735 | 11/1999 |
| JP | 2000-194323 | 7/2000 |
| JP | 2002-175052 | 6/2002 |

(Continued)

OTHER PUBLICATIONS

Japanese Notice of Reasons for Rejection, w/ English translation thereof, issued in Japanese Patent Application No. JP 2007-165221 dated Jul. 27, 2010.

(Continued)

*Primary Examiner* — Sumati Lefkowitz

*Assistant Examiner* — Andrew Yeretsky

(74) *Attorney, Agent, or Firm* — McDermott Will & Emery LLP

(57) ABSTRACT

A driving circuit for a display device for selectively outputting a driving voltage positive or negative with respect to a given reference voltage of the display device in accordance with an image signal, includes an input stage circuit; and an output stage circuit for outputting a driving voltage between a given high voltage and a first intermediate voltage or a driving voltage between a second intermediate voltage and a given low voltage in accordance with a pair of output stage control signals output from the input stage circuit.

2 Claims, 6 Drawing Sheets

(56) References Cited

FOREIGN PATENT DOCUMENTS

| | | |
|---|---|---|
| JP | 2004-032603 | 1/2004 |
| JP | 2005-266738 | 9/2005 |
| JP | 2005-352190 | 12/2005 |
| JP | 2006-276879 | 10/2006 |
| WO | WO 00/058777 | 10/2000 |
| WO | WO 01/09672 A1 | 2/2001 |

OTHER PUBLICATIONS

Japanese Office Action, with English translation, issued in Japanese Patent Application No. 2007-165221, mailed Oct. 26, 2010.

Japanese Office Action, with English translation, issued in Japanese Patent Application No. 2010-216105, mailed Oct. 26, 2010.

* cited by examiner

DISPLAY DEVICE AND DRIVING CIRCUIT FOR DISPLAY DEVICE

BACKGROUND OF THE INVENTION

The present invention relates to a display device such as a liquid crystal display device and a driving circuit for driving the display device.

In a display device such as a liquid crystal display device, AC driving in which driving voltages positive and negative with respect to a potential of a counter electrode of a display panel are applied to a capacitive load is generally performed. A known example of a driving circuit used for generating such driving voltages is shown in FIG. 1 of Japanese Laid-Open Patent Publication No. 2002-175052.

As shown in this drawing, the driving circuit includes output transistors 11 and 12 connected in series between a high-side power source 8 (VDD) and an intermediate-side power source 10 (VDD/2). It also includes output transistors 13 and 14 connected in series between the intermediate-side power source 10 (VDD/2) and a low-side power source 9 (VSS).

The output transistors 11 and 12 and the output transistors 13 and 14 are respectively controlled by differential input stage circuits 2 and 3 switched by switching elements 6 and 7 so as to alternately apply positive and negative voltages to a capacitive load.

Thus, the capacitive load is charged/discharged by the intermediate-side power source 10 no matter whether the driving voltage is switched to be positive or negative, and thus, power consumption is reduced.

In the case where the differential input stage circuits 2 and 3 are switched by the switching elements 6 and 7 in the aforementioned manner, however, the accuracy in the driving voltages tends to be lowered and the number of necessary switching circuits is disadvantageously large.

SUMMARY OF THE INVENTION

The present invention was devised in consideration of the aforementioned disadvantages, and an object of the invention is reducing power consumed in AC driving a display device while preventing the accuracy lowering caused in switching the output of a differential input stage circuit.

In order to achieve the object, in one aspect of the invention, the driving circuit for a display device for selectively outputting a driving voltage positive or negative with respect to a given reference voltage of the display device in accordance with an image signal, includes an input stage circuit; and an output stage circuit for outputting a driving voltage between a given high voltage and a first intermediate voltage or a driving voltage between a second intermediate voltage and a given low voltage in accordance with a pair of output stage control signals output from the input stage circuit.

The output stage circuit may include a high-voltage-side transistor and a low-voltage-side transistor connected in series to each other; a high-voltage-side voltage supplying circuit for selectively supplying the high voltage or the first intermediate voltage to the high-voltage-side transistor; and a low-voltage-side voltage supplying circuit for selectively supplying the second intermediate voltage or the low voltage to the low-voltage-side transistor.

Alternatively, the output stage circuit may include first and second transistors connected in series to each other between the high voltage and the first intermediate voltage; third and fourth transistors connected in series to each other between the second intermediate voltage and the low voltage; and an output selecting switch circuit for selectively outputting, as the driving voltage, a voltage on a node between the first and second transistors or a voltage on a node between the third and fourth transistors.

Thus, power voltages to be supplied to the high-voltage-side transistor and the low-voltage-side transistor or voltages to be supplied to the first and second transistors and the third and fourth transistors can be suppressed to be low, and hence, the power consumption can be easily suppressed to be small. Furthermore, accuracy of the driving voltage can be easily kept high.

Alternatively, the input stage circuit may include a P-channel transistor and an N-channel transistor connected in parallel to each other and connected, at both ends thereof, respectively to control terminals of the high-voltage-side transistor and the low-voltage-side transistor; and a bias applying circuit for applying, to control terminals of the P-channel transistor and the N-channel transistor, given bias voltages corresponding to selection of voltages supplied to the high-voltage-side transistor and the low-voltage-side transistor of the output stage circuit, or may include a P-channel transistor and an N-channel transistor connected in parallel to each other and connected, at both ends thereof, respectively to control terminals of the first and third transistors and the second and fourth transistors; and a bias applying circuit for applying, to control terminals of the P-channel transistor and the N-channel transistor, given bias voltages corresponding to selection of the voltages on the nodes of the output stage circuit.

Thus, the transient response characteristic of the driving signal can be easily improved.

DETAILED DESCRIPTION OF THE INVENTION

Figure 1:
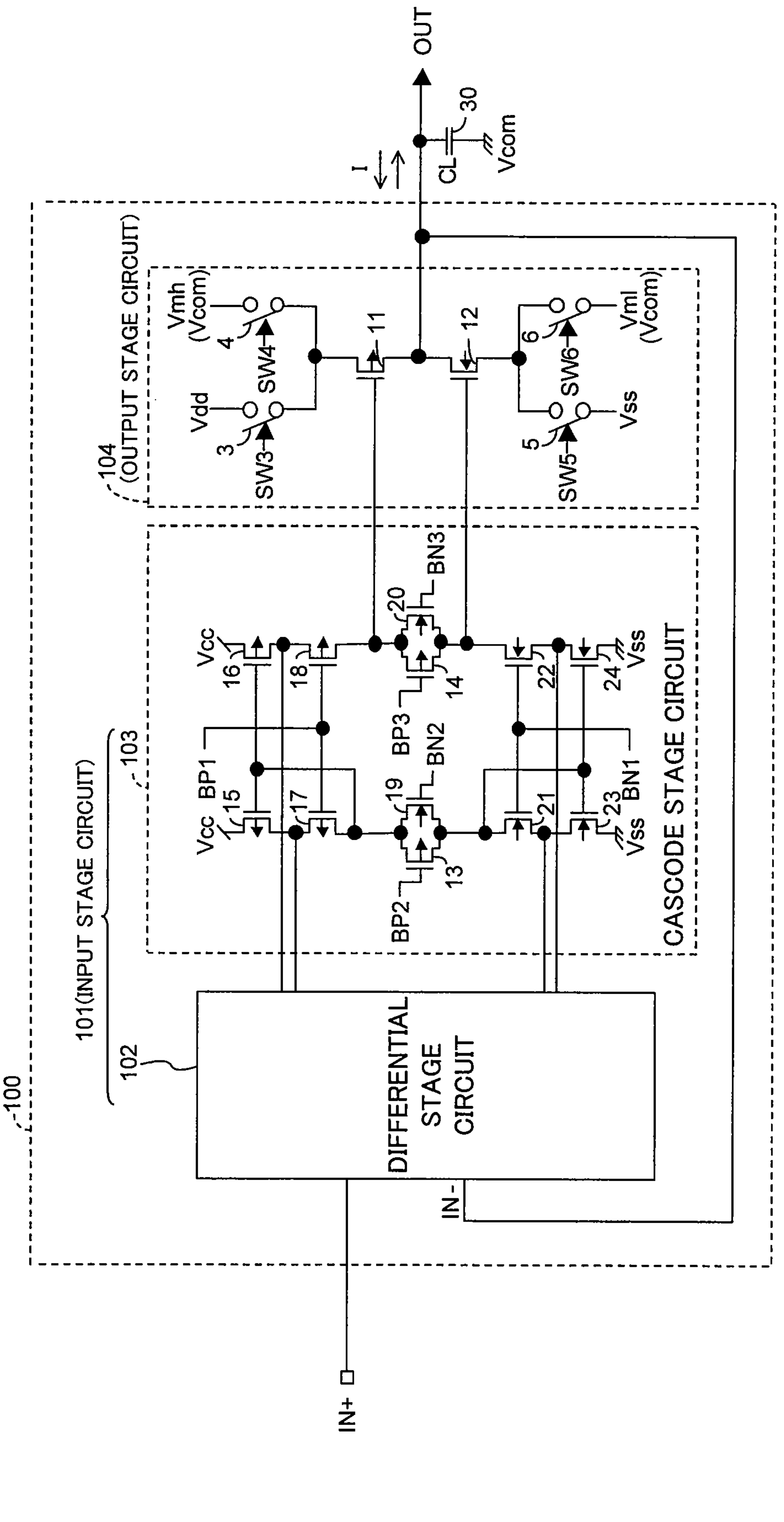
FIG. 1 is a circuit diagram for showing the architecture of a principal part of a display device driving circuit 100 according to Embodiment 1 of the invention.

Preferred embodiments of the invention will now be described with reference to the accompanying drawings. It is noted that like reference numerals are used to refer to like elements in the respective embodiments so as to omit the description.

Embodiment 1

FIG. 1 is a circuit diagram for showing the architecture of a principal part of a display device driving circuit 100 according to Embodiment 1 of the invention used for driving a display device such as a liquid crystal display panel. As shown in FIG. 1, the display device driving circuit 100 includes an input stage circuit 101 and an output stage circuit 104.

The input stage circuit 101 includes a differential stage circuit 102 and a cascode stage circuit 103.

The differential stage circuit 102 outputs a signal in accordance with a difference between an image signal IN+ and a driving signal IN− (or OUT) output from the display device driving circuit 100.

The cascode stage circuit 103 includes transistors 13, 14, 15, 16, 17, 18, 19, 20, 21, 22, 23 and 24 and, under application of bias voltages BN1, BN2, BN3, BP1, BP2 and BP3, outputs a pair of output stage control signals used for controlling the output stage circuit 104 in accordance with the output signal output by the differential stage circuit 102.

Also, the output stage circuit 104 includes transistors 11 and 12 serially connected to each other so as to output, as the driving signal OUT, a voltage obtained on the node between these transistors. Thus, a liquid crystal capacitance CL formed between a pixel electrode and a common electrode 30 is charged/discharged by a charge/discharge current I through, for example, a source line of a liquid crystal display panel. The charge/discharge current I is controlled to be a constant current by, for example, the cascode stage circuit 103.

The output stage circuit 104 further includes switches 3, 4, 5 and 6 respectively controlled in accordance with switch signals SW3, SW4, SW5 and SW6, so that a given high voltage Vdd or a first intermediate voltage Vmh can be selectively applied to the transistor 11 and that a given low voltage Vss or a second intermediate voltage Vml can be selectively applied to the transistor 12. At this point, the first and second intermediate voltages Vmh and Vml are set to have absolute values smaller than a voltage of the driving signal OUT at a black level and are preferably set to be as high as possible within this range for reducing the power consumption.

The operation of the display device driving circuit 100 having the aforementioned architecture will now be described. In the following description, it is assumed for simplification that the high voltage Vdd and the low voltage Vss are given voltages respectively equal to positive and negative white level voltages, that a common electrode voltage Vcom and the first and second intermediate voltages Vmh and Vml are given black level voltages equal to one another and are equal to an average voltage of the high voltage Vdd and the low voltage Vss. It is noted that the positive and negative voltages herein mentioned do not mean absolute potentials being positive and negative but means a relative relationship with a given reference voltage such as the common electrode voltage Vcom.

Figure 2:
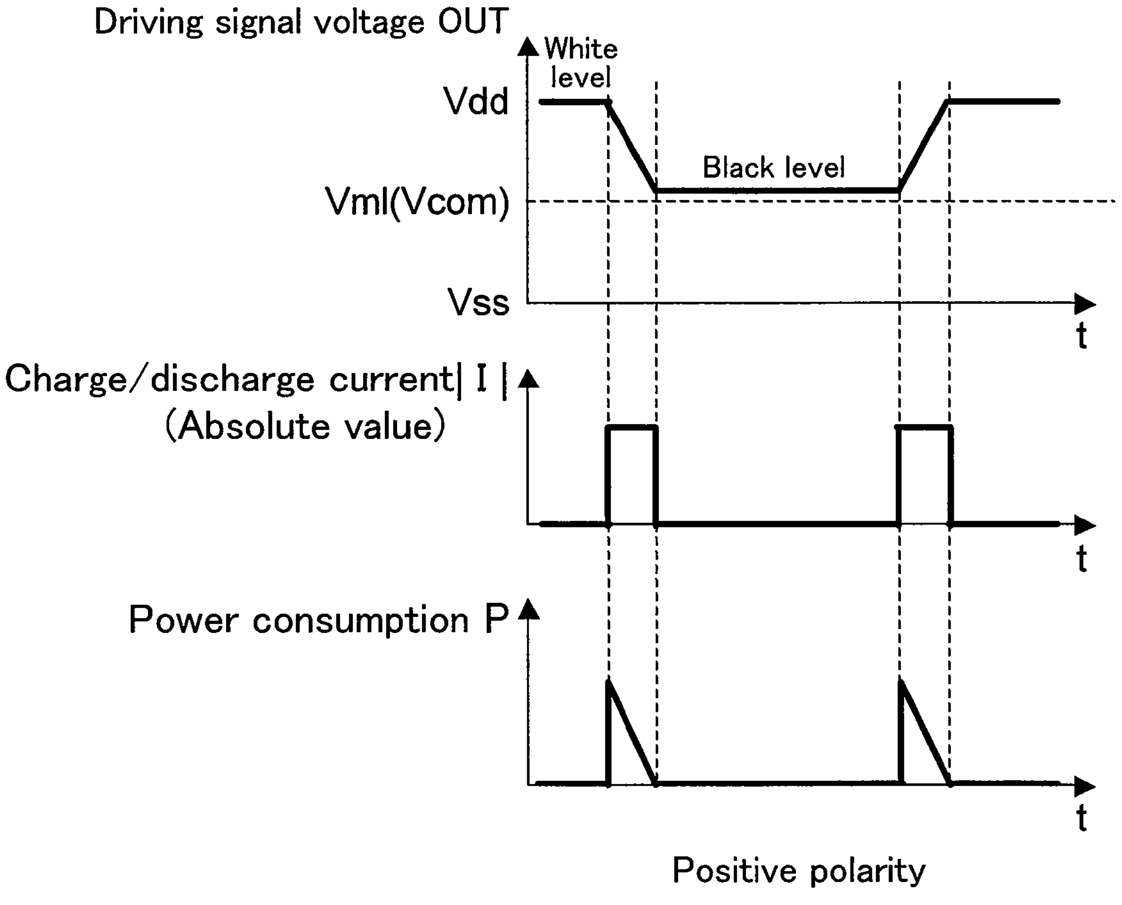
FIG. 2 is a graph for showing power consumption and the like obtained when a driving signal OUT of the driving circuit has a positive value.

In the case where a driving signal OUT with positive polarity is output, the switches 3 and 6 are placed in an on state and the transistors 11 and 12 are operated at voltages between the high voltage Vdd and the common electrode voltage Vcom. At this point, when it is assumed, for example, that the transistor 11 has low resistance and the transistor 12 has high resistance in accordance with an image signal, the driving signal OUT corresponds to the high voltage Vdd, that is, a positive white level voltage, as shown in FIG. 2.

Next, when it is assumed, for example, that the transistor 11 attains high resistance and the transistor 12 attains low resistance in accordance with an image signal, charge stored in the liquid crystal capacitance CL is discharged by the charge/discharge current I passing through the transistor 12, and as a result, the driving signal OUT is linearly lowered to the common electrode voltage Vcom, that is, a black level voltage. Power consumed at this point corresponds to a product of the charge/discharge current I and a difference between the driving signal OUT and the common electrode voltage Vcom. In other words, as compared with the case where the source of the transistor 12 is connected to the low voltage Vss, the consumed power is reduced. Such reduction of the power consumption is attained similarly in the case where the level of the driving signal OUT is changed in half tone as far as the liquid crystal capacitance CL is discharged.

Figure 3:
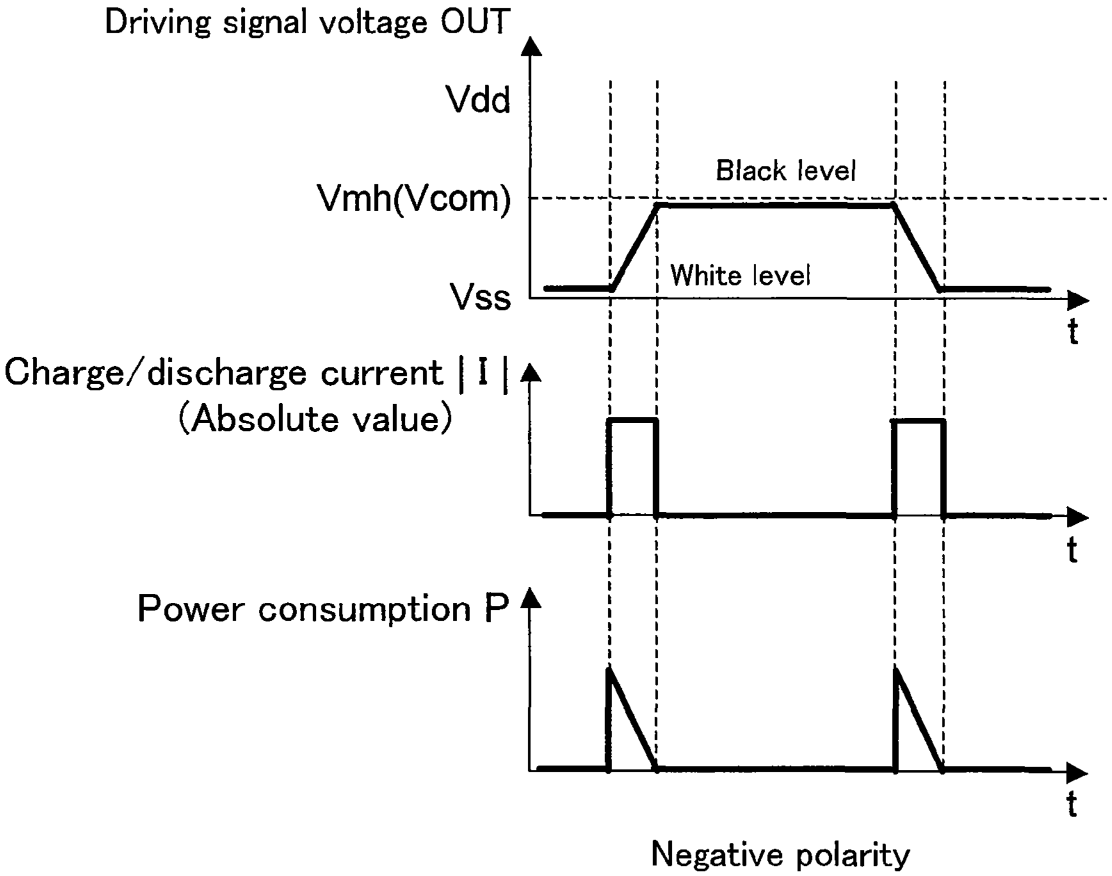
FIG. 3 is a graph for showing power consumption and the like obtained when the driving signal OUT of the driving circuit has a negative value.

On the other hand, in the case where a driving signal OUT with negative polarity is output, the switches 4 and 5 are placed in an on state, and hence, the transistors 11 and 12 are operated at voltages between the common electrode voltage Vcom and the low voltage Vss. In this case, when the driving signal is changed between, for example, the low voltage Vss corresponding to a negative white level voltage and the common electrode voltage Vcom corresponding to a black level voltage as shown in FIG. 3, the consumed power corresponds to a product of the charge/discharge current I and a difference between the common electrode voltage Vcom and the driving signal OUT. Thus, as compared with the case where the source of the transistor 11 is connected to the high voltage Vdd, the power consumption is also reduced.

As described above, when the power voltages to be supplied to the transistors 11 and 12 are switched in accordance with the polarity of a driving signal so as to suppress the voltages on the ends of the transistors 11 and 12 to be low, the power consumption can be easily suppressed to be small. Furthermore, transistors used in the switches 3 through 6 used for switching the high voltage Vdd, the low voltage Vss and the intermediate voltages Vmh and Vml can be easily made to have comparatively low impedance, and hence, the area of these transistors can be easily made small. Moreover, since there is no need to switch the output of the differential stage circuit 102 in changing the polarity of the driving signal, accuracy lowering otherwise caused by such switching can be easily suppressed.

Embodiment 2

Figure 4:
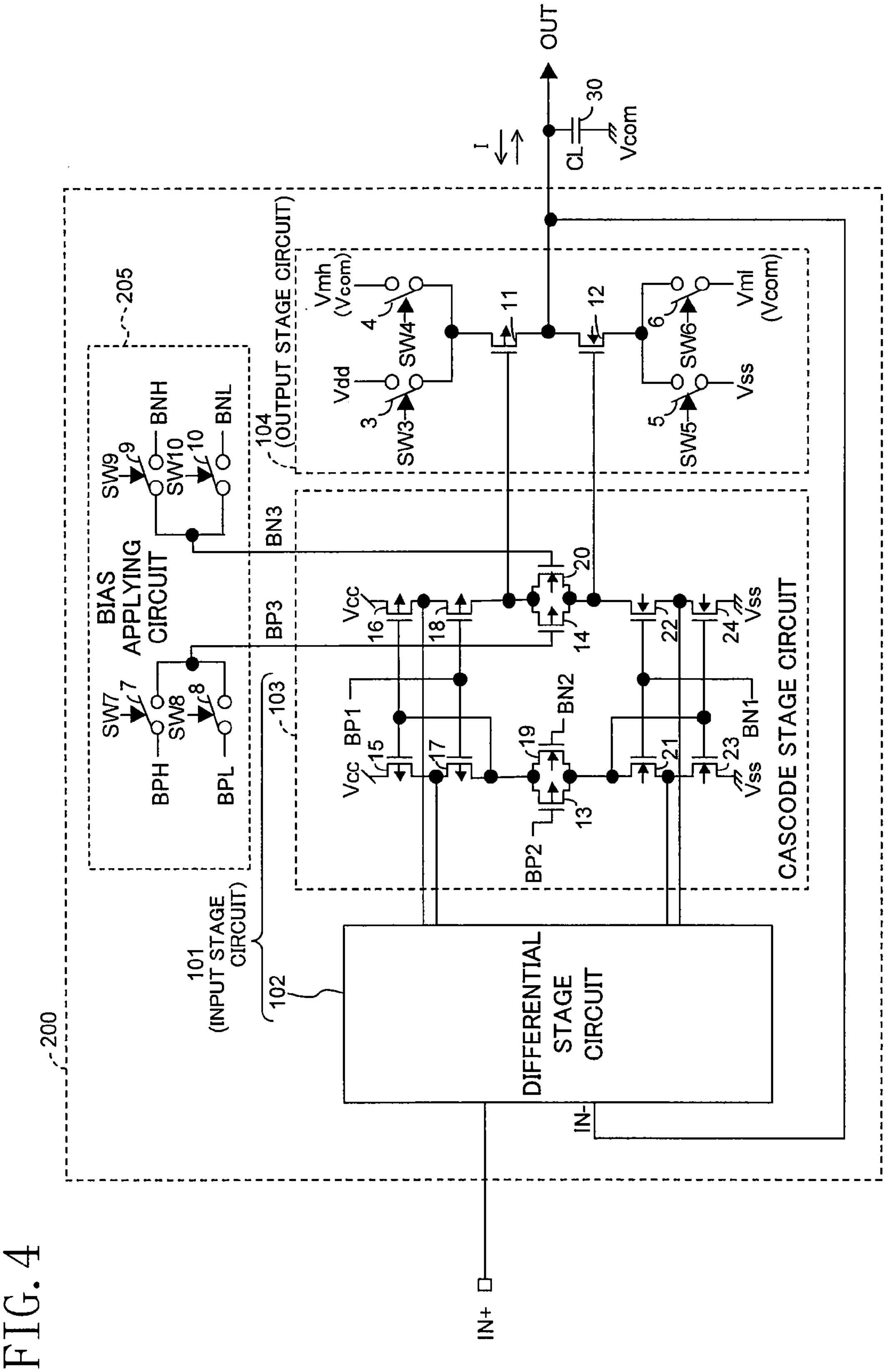
FIG. 4 is a circuit diagram for showing the architecture of a principal part of a display device driving circuit 200 according to Embodiment 2 of the invention.

FIG. 4 is a circuit diagram for showing the architecture of a principal part of a display device driving circuit 200 according to Embodiment 2 of the invention. The display device driving circuit 200 includes a bias applying circuit 205 in addition to the composing elements of the display device driving circuit 100 of Embodiment 1. The bias applying circuit 205 includes switches 7, 8, 9 and 10 respectively controlled in accordance with switch signals SW7, SW8, SW9 and SW10, so as to switch the bias voltages BN3 and BP3 to be applied in the cascode stage circuit 103 in accordance with the polarity of a driving signal OUT.

Specifically, in the case where the switches 3 and 6 of the output stage circuit 104 are placed in an on state so as to output a driving signal OUT with positive polarity, the switches 7 and 9 of the bias applying circuit 205 are placed in an on state so as to apply bias voltages BPH and BNH respectively to gates (control terminals) of the transistors (the P-channel transistor and the N-channel transistor) 14 and 20 of the cascode stage circuit 103. On the other hand, in the case where a driving signal OUT with negative polarity is output, the switches 8 and 10 are placed in an on state so as to apply bias voltages BPL and BNL respectively to the gates of the transistors 14 and 20.

Since the bias voltages to be applied to the transistors 14 and 20 are switched in accordance with the polarity of the driving voltage OUT in the aforementioned manner, when these bias voltages are set to attain relationships of, for example, BNH>BNL and BPH>BPL, the resistance characteristics of the transistors 14 and 20 can be made uniform, and therefore, the transient response characteristic of the driving signal OUT can be easily improved.

Embodiment 3

Figure 5:
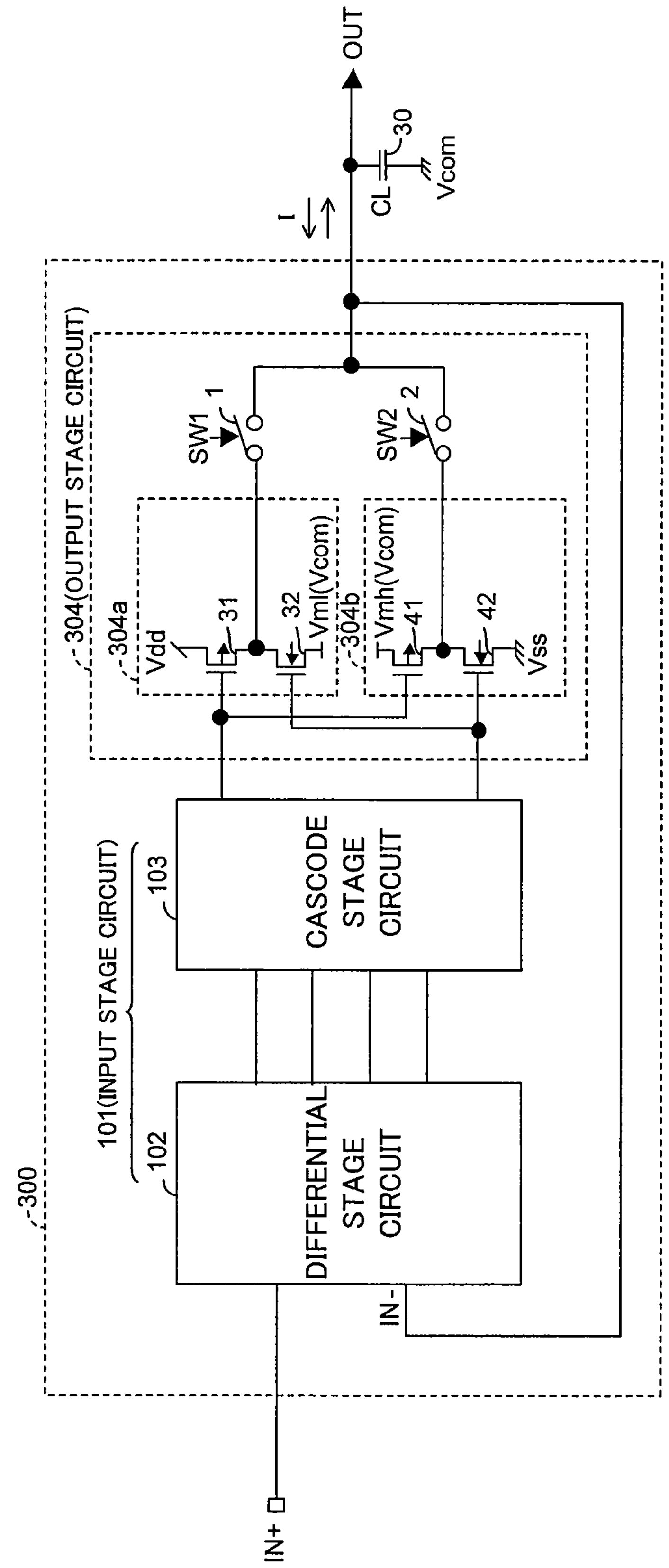
FIG. 5 is a circuit diagram for showing the architecture of a principal part of a display device driving circuit 300 according to Embodiment 3 of the invention.

FIG. 5 is a circuit diagram for showing the architecture of a principal part of a display device driving circuit 300 according to Embodiment 3 of the invention. The display device driving circuit 300 is different from the display device driving circuit 100 of Embodiment 1 in including an output stage circuit 304 instead of the output stage circuit 104.

The output stage circuit 304 includes output circuits 304*a* and 304*b* and switches 1 and 2 respectively controlled in accordance with switch signals SW1 and SW2.

The output circuit 304*a* includes transistors 31 and 32 connected in series to each other and is driven by a high voltage Vdd and a first intermediate voltage Vml. On the other hand, the output circuit 304*b* includes transistors 41 and 42 and is driven by a second intermediate voltage Vmh and a low voltage Vss. In other words, the output circuit 304*a* is placed in a state substantially the same as that of the output stage circuit 104 attained when the switches 3 and 6 are in an on state and the output circuit 304*b* is placed in a state substantially the same as that attained when the switches 4 and 5 are in an on state.

The switch 1 is turned on when a driving signal OUT with positive polarity is output and the switch 2 is turned on when a driving signal OUT with negative polarity is output. Each of these switches 1 and 2 may be a path gate including P- and N-channel transistors connected in parallel and preferably has resistance as low as possible when these P- and N-channel transistors are in on state.

Also in this architecture, power consumed when the driving signal OUT with positive polarity is output corresponds to a product of a charge/discharge current I and a difference between the high voltage Vdd and a common electrode voltage Vcom, and power consumed when the driving signal OUT with negative polarity is output corresponds to a product of the charge/discharge current I and a difference between the common electrode voltage Vcom and the low voltage Vss. Accordingly, the power consumption can be also easily suppressed to be small without causing the accuracy lowering otherwise caused in switching the output of the differential stage circuit 102.

Also in the architecture of Embodiment 3, the bias applying circuit 205 described in Embodiment 2 may be provided so as to apply an appropriate bias to each transistor included in the cascode stage circuit 103 in accordance with the polarity of the driving signal OUT.

Embodiment 4

Figure 6:
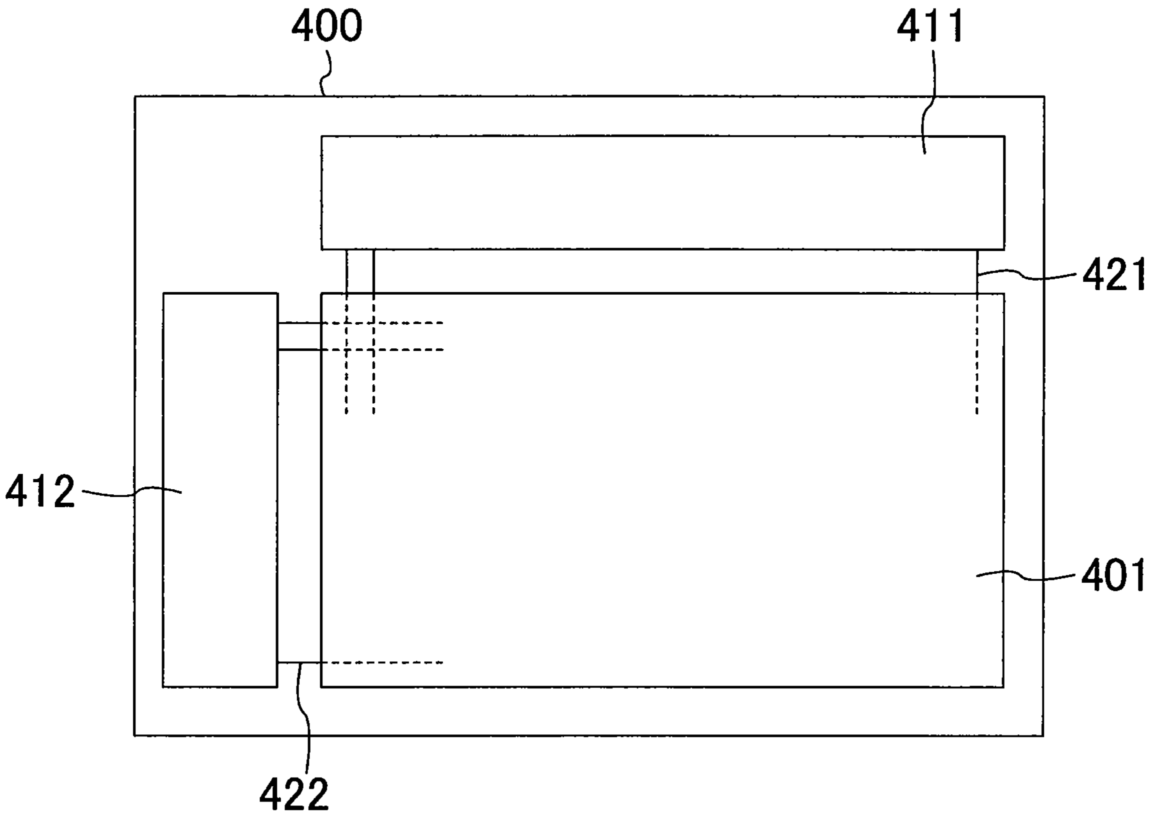
FIG. 6 is a plan view for schematically showing the architecture of a liquid crystal display panel 400 according to Embodiment 4 of the invention.

Each display device driving circuit described in Embodiments 1 through 3 may be used in, for example, a liquid crystal display panel 400 shown in FIG. 6. The liquid crystal display panel 400 includes a liquid crystal display part 401, a source driver 411, a gate driver 412 and a plurality of source lines 421 and gate lines 422 respectively corresponding to the number of pixels. The source driver 411 includes a plurality of display device driving circuits 100 or the like of any of the embodiments described above, so that each driving signal OUT can be supplied through a corresponding source line 421 to a pixel electrode not shown of a pixel selected by a gate line 422.

As described so far, according to the present invention, the power consumed in AC driving a display device can be reduced and the accuracy of the driving voltage can be easily kept high.

What is claimed is:

1. A driving circuit for a display device for selectively outputting a driving voltage positive or negative with respect to a given reference voltage of the display device in accordance with an image signal, comprising:

an input stage circuit; and an output stage circuit for outputting a driving voltage between a given high voltage and the given reference voltage or a driving voltage between the given reference voltage and a given low voltage in accordance with a pair of output stage control signals output from the input stage circuit, wherein the output stage circuit includes:

a high-voltage-side transistor and a low-voltage-side transistor connected in series to each other;

a high-voltage-side voltage supplying circuit for selectively supplying the high voltage or the given reference voltage to the high-voltage-side transistor; and a low-voltage-side voltage supplying circuit for selectively supplying the given reference voltage or the low voltage to the low-voltage-side transistor, and the input stage circuit includes:

a P-channel transistor and an N-channel transistor connected in parallel to each other and connected, at both ends thereof, respectively to control terminals of the high-voltage-side transistor and the low-voltage-side transistor; and a bias supplying circuit for applying bias voltages to control terminals of the P-channel transistor and the N-channel transistor, said bias voltages corresponding to:

a first selection mode in which the high voltage is supplied to the high-voltage-side transistor and the reference voltage is supplied to the low-voltage-side transistor, and a second selection mode in which the reference voltage is supplied to the high-voltage-side transistor, and the low voltage is supplied to the low-voltage-side transistor, and wherein bias voltages of said first selection mode are different from bias voltages of said second selection mode.

2. A display device comprising:

the driving circuit of claim 1; and a display part for displaying an image in accordance with the driving voltage output from the driving circuit and the given reference voltage.

* * * * *